United States Patent
Lin et al.

(10) Patent No.: US 8,319,284 B2
(45) Date of Patent: Nov. 27, 2012

(54) LATERALLY DIFFUSED METAL-OXIDE-SEMICONDUCTOR DEVICE

(75) Inventors: Wei-Chieh Lin, Hsinchu (TW); Ho-Tai Chen, Taipei County (TW); Jia-Fu Lin, Yilan County (TW); Po-Hsien Li, Tainan County (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 231 days.

(21) Appl. No.: 12/839,426

(22) Filed: Jul. 20, 2010

(65) Prior Publication Data

US 2011/0278671 A1 Nov. 17, 2011

(30) Foreign Application Priority Data

May 11, 2010 (TW) ................. 99114947 A

(51) Int. Cl.
 *H01L 29/66* (2006.01)
(52) U.S. Cl. ............. 257/343; 257/337; 257/E29.261; 257/E27.06
(58) Field of Classification Search ............ 257/337, 257/343, E29.261
 See application file for complete search history.

(56) References Cited

U.S. PATENT DOCUMENTS

| | | | |
|---|---|---|---|
| 7,235,845 B2 | 6/2007 | Xu | |
| 7,282,765 B2 | 10/2007 | Xu | |
| 7,560,808 B2 | 7/2009 | Korec | |
| 7,589,379 B2 | 9/2009 | Amaratunga | |
| 2007/0085204 A1 | 4/2007 | Korec | |
| 2008/0246086 A1 | 10/2008 | Korec | |
| 2011/0014766 A1* | 1/2011 | Hebert | ............ 438/286 |

* cited by examiner

*Primary Examiner* — Eugene Lee
*Assistant Examiner* — Elias M Ullah
(74) *Attorney, Agent, or Firm* — Winston Hsu; Scott Margo

(57) ABSTRACT

A laterally diffused metal-oxide-semiconductor device includes a substrate, a gate dielectric layer, a gate polysilicon layer, a source region, a drain region, a body region, a first drain contact plug, a source polysilicon layer, an insulating layer, and a source metal layer. The source polysilicon layer disposed on the gate dielectric layer above the drain region can serve as a field plate to enhance the breakdown voltage and to increase the drain-to-source capacitance. In addition, the first drain contact plug of the present invention can reduce the drain-to-source on-resistance and the horizontal extension length.

20 Claims, 9 Drawing Sheets

LATERALLY DIFFUSED METAL-OXIDE-SEMICONDUCTOR DEVICE

BACKGROUND OF THE INVENTION

1. Field of the Invention

The present invention relates to a laterally diffused metal-oxide-semiconductor device, and more particularly to a laterally diffused metal-oxide-semiconductor device which can improve capacitance characteristics with the optimized on-resistance.

2. Description of the Prior Art

A laterally diffused metal-oxide-semiconductor (LDMOS) device is a common semiconductor power device. Due to the horizontal structure of the laterally diffused metal-oxide-semiconductor device, it is easily formed and integrated with the conventional semiconductor techniques so as to reduce the manufacturing cost. Since the laterally diffused metal-oxide-semiconductor device has a higher breakdown voltage and a higher output power, it is widely applied to the electronic devices, such as a power converter, a power amplifier, a switch, and a rectifier.

Please refer to FIG. 1, which is a schematic cross-sectional view illustrating a laterally diffused metal-oxide-semiconductor device in the prior art. As shown in FIG. 1, a conventional laterally diffused metal-oxide-semiconductor device is usually disposed in a p-type semiconductor substrate 10, and the p-type semiconductor substrate 10 includes an n-type drift region 11, a p-type body region 12, an n-type source region 13, and an n-type drain region 14. The p-type body region 12 is disposed in the n-type drift region 11, and the n-type source region 13 is disposed in the p-type body region 12. The n-type drain region 14 is disposed in the n-type drift region 11 and at a side of the n-type source region 13. Furthermore, a source electrode 15 is disposed on the n-type source region 13, and a drain electrode 16 is disposed on the n-type drain region 14. A gate electrode 17 is disposed between the source electrode 15 and the drain electrode 16. In addition, a field oxide layer 18 is disposed on n-type drift region 11 and between the gate electrode 17 and the drain electrode 16.

As shown in FIG. 1, the voltage-withstand ability of the laterally diffused metal-oxide-semiconductor device in the prior art is usually improved by increasing the length of the drift region or additionally disposing a field oxide layer. However, increasing the horizontal extension length of the device not only decreases the integration degree of the device, but also increases the on-resistance of the device. On the other hand, a trench semiconductor device with the vertical structure is developed in the prior art to improve the laterally diffused metal-oxide-semiconductor device, such as reducing the on-resistance. But the trench semiconductor device has a high gate-to-drain capacitance (Cgd). Accordingly, when the trench semiconductor device is applied to the switching device, this high gate-to-drain capacitance will increase the transition time of the voltage and influences the power loss. As a result, a semiconductor device which can improve both of the capacitance characteristic and the on-resistance is required in the industry.

SUMMARY OF THE INVENTION

It is therefore one of the objectives of the present invention to provide a laterally diffused metal-oxide-semiconductor device to solve the problem in the prior art.

According to a preferred embodiment of the present invention, a laterally diffused metal-oxide-semiconductor device is provided. The laterally diffused metal-oxide-semiconductor device includes a substrate, a gate dielectric layer, a gate polysilicon layer, a source region, a drain region, a body region, a first drain contact plug, a source polysilicon layer, an insulating layer, and a source metal layer. The substrate has an upper surface and a bottom surface. The gate dielectric layer is disposed on the upper surface of the substrate. The gate polysilicon layer is disposed on the gate dielectric layer. The source region and a drain region both have a first conductivity type, and the source region and the drain region are disposed in the substrate and respectively located at two opposite sides of the gate polysilicon layer. The body region has a second conductivity type, and the body region surrounds the source region and extends to the substrate under the gate polysilicon layer. The first drain contact plug is disposed in the substrate and located at a side of the drain region opposite to the source region, and the first drain contact plug is in contact with the drain region. The source polysilicon layer is disposed on the gate dielectric layer above the drain region. The insulating layer is disposed on the substrate and covering the gate polysilicon layer, the source polysilicon layer, and the gate dielectric layer. The source metal layer is disposed on the insulating layer.

According to another preferred embodiment of the present invention, a laterally diffused metal-oxide-semiconductor device is provided. The laterally diffused metal-oxide-semiconductor device includes a substrate, a gate dielectric layer, a gate polysilicon layer, a source region, a drain region, a body region, a first drain contact plug, a trench, and a first drain metal layer. The substrate has an upper surface and a bottom surface. The gate dielectric layer is disposed on the upper surface of the substrate. The gate polysilicon layer is disposed on the gate dielectric layer. The source region and a drain region both have a first conductivity type, and the source region and the drain region are disposed in the substrate and respectively located at two opposite sides of the gate polysilicon layer. The body region has a second conductivity type, and the body region surrounds the source region and extends to the substrate under the gate polysilicon layer. The first drain contact plug is disposed in the substrate and located at a side of the drain region opposite to the source region, and the first drain contact plug is in contact with the drain region. In addition, the trench is disposed in the substrate, and the trench is adjacent to the bottom surface and under the first drain contact plug. The first drain metal layer is disposed on the bottom surface of the substrate and fills the trench, and the first drain metal layer is electrically connected to the first drain contact plug.

The laterally diffused metal-oxide-semiconductor device of the present invention utilize the source polysilicon layer, which is disposed on the gate dielectric layer above the drain region, to serve as a field plate for reducing the electric field. The voltage-withstand ability of the laterally diffused metal-oxide-semiconductor device can be improved, and the laterally diffused metal-oxide-semiconductor device can have a higher breakdown voltage. Also, the source polysilicon layer can effectively increase the drain-to-source capacitance and improve the output capacitance. Furthermore, the present invention can effectively decrease the gate-to-drain capacitance and reduce the input capacitance and the reverse transfer capacitance. In addition, by the first drain contact plug, the present invention can improve the drain-to-source on-resistance to reduce the power loss. Moreover, the present invention can effectively reduce the horizontal extension length and increase the integration degree of the device.

These and other objectives of the present invention will no doubt become obvious to those of ordinary skill in the art after reading the following detailed description of the preferred embodiment that is illustrated in the various figures and drawings.

DETAILED DESCRIPTION

In the following specifications and claims, certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". Also, the term "electrically connect" is intended to mean either an indirect or direct electrical connection. Accordingly, if one device is coupled to another device, that connection may be through a direct electrical connection, or through an indirect electrical connection via other devices and connections.

Figure 1:
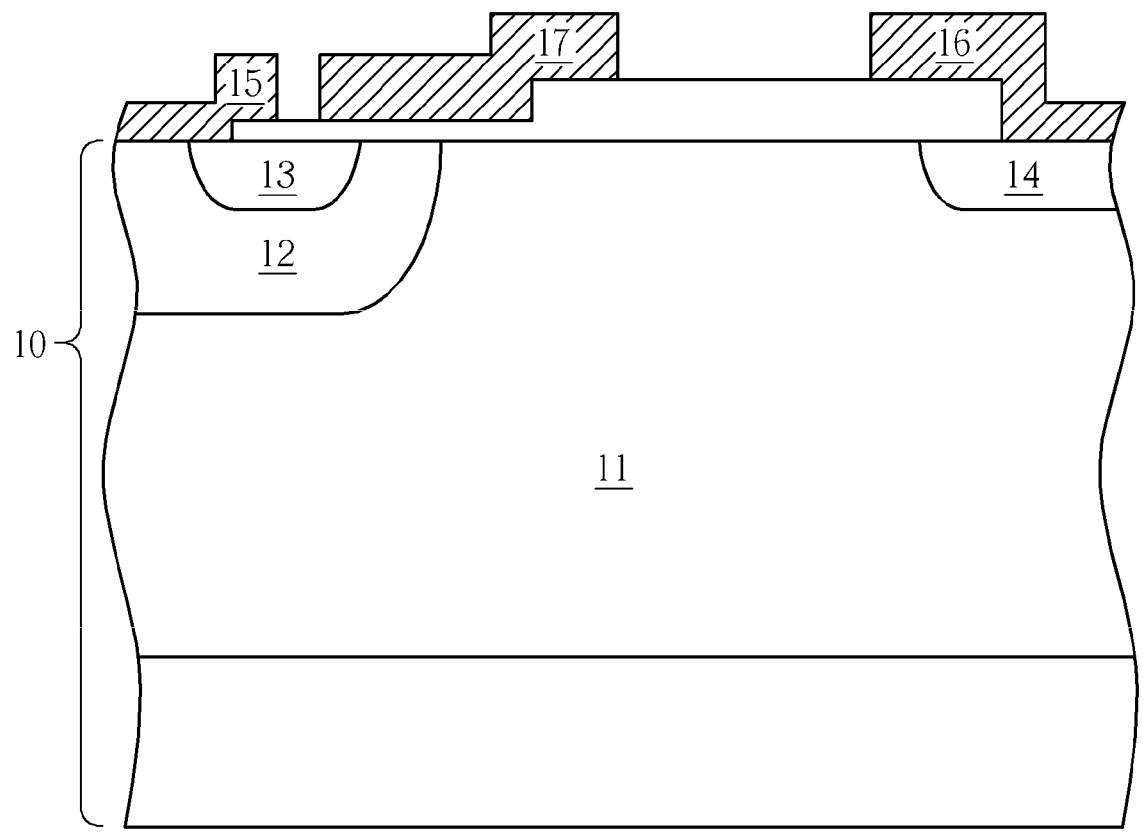
FIG. 1 is a schematic cross-sectional view illustrating a laterally diffused metal-oxide-semiconductor device in the prior art.
Figure 2:
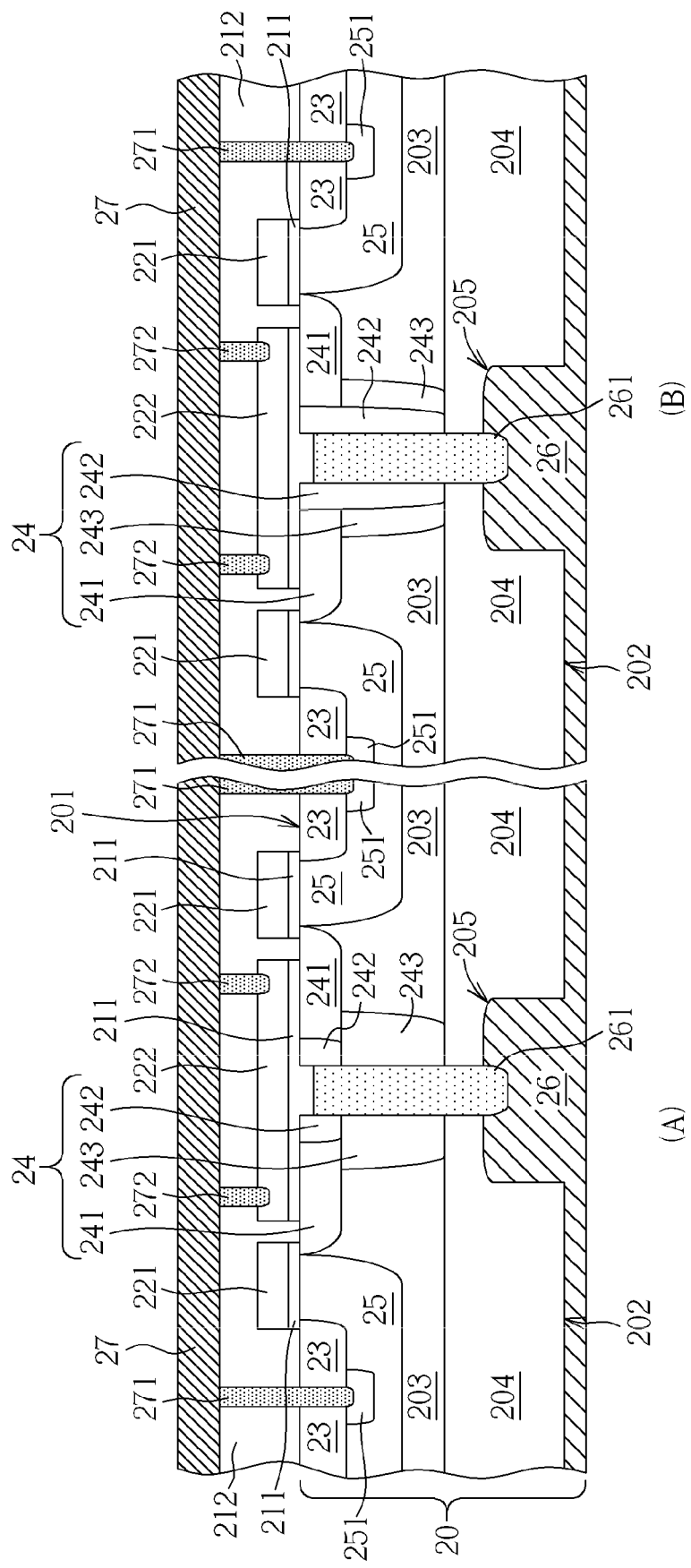
FIG. 2 is a schematic cross-sectional view illustrating a laterally diffused metal-oxide-semiconductor device according to a first preferred embodiment of the present invention.

Please refer to FIG. 2, which is a schematic cross-sectional view illustrating a laterally diffused metal-oxide-semiconductor device according to a first preferred embodiment of the present invention. As shown in FIG. 2, the laterally diffused metal-oxide-semiconductor device of the present embodiment includes a substrate 20, a gate dielectric layer 211, an insulating layer 212, a gate polysilicon layer 221, a source polysilicon layer 222, a source region 23, a drain region 24, a body region 25, a first drain contact plug 261, and a source metal layer 27. The substrate 20 has an upper surface 201 and a bottom surface 202, and the gate dielectric layer 211 is disposed on the upper surface 201 of the substrate 20, and the gate polysilicon layer 221 is disposed on the gate dielectric layer 211. Moreover, the source region 23 and the drain region 24 both have a first conductivity type, and the source region 23 and the drain region 24 are disposed in the substrate 20 and respectively located at two opposite sides of the gate polysilicon layer 221. The body region 25 has a second conductivity type, and the body region 25 is disposed in the substrate 20 under the source region 23 and the gate polysilicon layer 221. More specifically, the body region 25 surrounds the source region 23 and extends to the substrate 20 under the gate polysilicon layer 221. In the present preferred embodiment, the first conductivity type is n-type, and the second conductivity type is p-type, but it is not limited herein. For example, in another preferred embodiment, the first conductivity type may be p-type, and the second conductivity type may be n-type. In addition, the substrate 20 of the present preferred embodiment includes an epitaxial layer 203 and a base layer 204. The epitaxial layer 203 is disposed at a side which is adjacent to the upper surface 201 of the substrate 20, and the base layer 204 is disposed at a side which is adjacent to the bottom surface 202 of the substrate 20. The source region 23, the drain region 24, and the body region 25 are all disposed in the epitaxial layer 203. The epitaxial layer 203 has the second conductivity type, and the base layer 204 has the first conductivity type. More specifically, in the present preferred embodiment, the epitaxial layer 203 is p-type doped, and the base layer 204 is n-type doped, but it is not limited herein and can be adjusted according to the demand of the product.

Moreover, the source region 23 of the present preferred embodiment is a heavily doped region, and the drain region 24 includes a lightly doped drain (LDD) region 241, a heavily doped drain region 242, and a deep drain region 243. A surface of the lightly doped drain region 241 is the upper surface 201 of the substrate 20. The heavily doped drain region 242 is disposed in the substrate 20, and the heavily doped drain region 242 is respectively in contact with the lightly doped drain region 241 and the first drain contact plug 261. Also, the deep drain region 243 is disposed in the substrate 20 and at a side of the heavily doped drain region 242, and the deep drain region 243 is respectively in contact with the heavily doped drain region 242, the lightly doped drain region 241, and the first drain contact plug 261. Furthermore, the laterally diffused metal-oxide-semiconductor device of the present preferred embodiment includes a heavily doped body region 251, and the heavily doped body region 251 has the second conductivity type and is disposed in the body region 25 under the source region 23. It should be noted that the position of the lightly doped drain region 241, the heavily doped drain region 242, and the deep drain region 243 in the drain region 24 may have different types. Accordingly, FIG. 2 respectively shows two methods of positioning in the drain region 24; the drain region 24 at the left part (A) and the right part (B). FIG. 2 and the following figures with the left part (A) and the right part (B) are mainly utilized to show different examples, and the left part (A) and the right part (B) are shown in the same figure for comparison. Since the drain region 24 of the left part (A) is different from the drain region 24 of the right part (B), the left part (A) and the right part (B) are manufactured respectively. As shown in FIG. 2, the difference between the left part (A) and the right part (B) is the relative position of each region in the drain region 24. The lightly doped drain region 241 and the heavily doped drain region 242 of the left part (A) are adjacently connected to the upper surface 201 of the substrate 20, and the heavily doped drain region 242 and the deep drain region 243 are in contact with the first drain contact plug 261. The heavily doped drain region 242 of the right part (B) is in contact with the first drain contact plug 261. Accordingly, the lightly doped drain region 241 and the deep drain region 243 are electrically connected to the first drain contact plug 261 through the heavily doped drain region 242.

As shown in FIG. 2, the source polysilicon layer 222 is disposed on the gate dielectric layer 211 above the drain region 24. In the first preferred embodiment, one source polysilicon layer 222 is disposed between two adjacent gate polysilicon layers 221, wherein the source polysilicon layer 222 and the gate polysilicon layer 221 are formed together. In other words, the source polysilicon layer 222 and the gate polysilicon layer 221 are formed by performing a photo-etching-process on the same polysilicon layer (not shown in the figure).

Figure 3:
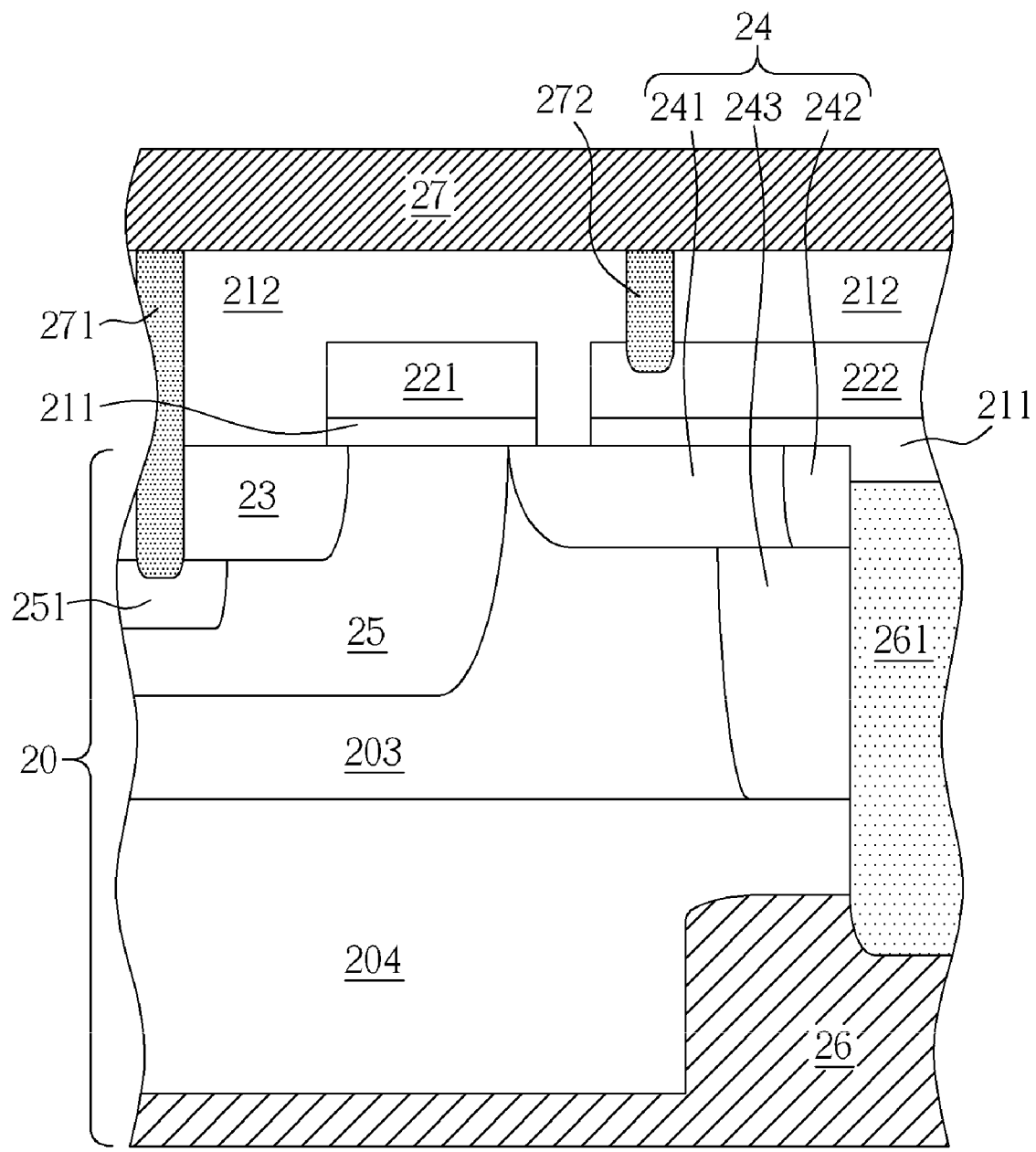
FIG. 3 is a schematic cross-sectional view illustrating a basic unit of the laterally diffused metal-oxide-semiconductor device according to the first preferred embodiment of the present invention.

Please refer to FIG. 3, which is a schematic cross-sectional view illustrating a basic unit of the laterally diffused metal-oxide-semiconductor device according to the first preferred embodiment of the present invention. As shown in FIG. 3, the basic unit of the laterally diffused metal-oxide-semiconductor device in the present invention may include a gate dielectric layer 211, a gate polysilicon layer 221, a source region 23, a drain region 24, a body region 25, a first drain contact plug 261, and a source polysilicon layer 222. In the preferred embodiment as shown in FIG. 2, the laterally diffused metal-oxide-semiconductor device of the left part (A) and the right part (B) share a first drain contact plug and a source polysilicon layer. In other words, each laterally diffused metal-oxide-semiconductor device includes two gate dielectric layers 211, two gate polysilicon layers 221, two source regions 23, two drain regions 24, two body regions 25, one first drain contact plug 261, one source polysilicon layer 222, and so on. Also, they are disposed in a substantially symmetrical way by taking the first drain contact plug 261 as the axis. More specifically, in each laterally diffused metal-oxide-semiconductor device, the source polysilicon layer 222 is disposed above two drain regions 24 and one first drain contact plug 261. Accordingly, the source polysilicon layer 222 may serve as a field plate for reducing the surface electric field, As a result, the voltage-withstand ability of the laterally diffused metal-oxide-semiconductor device can be improved, and the laterally diffused metal-oxide-semiconductor device of the present invention can have a higher breakdown voltage.

Please refer to FIG. 2 again. As shown in FIG. 2, the insulating layer 212 is disposed on the substrate 20 and covers the gate polysilicon layer 221, the source polysilicon layer 222 and the gate dielectric layer 211. Also, the source metal layer 27 is disposed on the insulating layer 212. In addition, the laterally diffused metal-oxide-semiconductor device of the present preferred embodiment includes a first source contact plug 271 and a second source contact plug 272. The first source contact plug 271 passes through the insulating layer 212 and electrically connects the source metal layer 27 to the source region 23, and the second source contact plug 272 passes through the insulating layer 212 and electrically connects the source metal layer 27 to the source polysilicon layer 222. Accordingly, the voltage of the source polysilicon layer 222 disposed above the drain region 24 is the same as that of the source metal layer 27, and a thin gate dielectric layer 211 is disposed between the source polysilicon layer 222 and the drain region 24. By the source polysilicon layer 222, the present invention can increase the drain-to-source capacitance (Cds) and improve the output capacitance (Coss). Compared to the trench semiconductor device with the vertical structure in the prior art, the laterally diffused metal-oxide-semiconductor device of the present invention can effectively decrease the gate-to-drain capacitance and reduce the input capacitance (Ciss) and the reverse transfer capacitance (Crss). When the laterally diffused metal-oxide-semiconductor device is applied to the switching device, the gate-to-drain capacitance determines the transition time of the voltage and influences the power loss of the switching device. As a result, the present invention has a lower gate-to-drain capacitance to effectively increase the switching speed and to reduce the power loss.

As shown in FIG. 2, the first drain contact plug 261 is disposed in the substrate 20 and at a side of the drain region 24 opposite to the source region 23, and the first drain contact plug 261 is in contact with the drain region 24. Moreover, the laterally diffused metal-oxide-semiconductor device of the present preferred embodiment further includes a trench 205 and a first drain metal layer 26. The trench 205 is disposed in the substrate 20 and adjacent to the bottom surface 202, and the trench 205 is under the first drain contact plug 261. Also, the first drain metal layer 26 is disposed on the bottom surface 202 of the substrate 20 and fills the trench 205, and the first drain metal layer 26 is electrically connected to the first drain contact plug 261 which extends into the trench 205. More specifically, by the trench 205 of the present invention, the first drain contact plug 261 directly extends into the first drain metal layer 26. It should be noted that the present invention may have a plurality of the first drain contact plugs 261, and the first drain metal layer 26 is electrically connected to a plurality of the first drain contact plugs 261. For example, the left part (A) and the right part (B) in FIG. 2 may connect to each other, so that the first drain metal layer 26 is electrically connected to two first drain contact plugs 261.

In the present preferred embodiment, the material of the first source contact plug 27 and the second source contact plug 272 may be tungsten, the material of the first drain contact plug 261 may be tungsten or aluminum, and the material of the first drain metal layer 26 may be copper, tungsten, or silver. But they are not limited herein and can be other conductive materials according to the demand of the product specifications and process requirements. Therefore, by the first drain contact plug 261, the present invention can improve the drain-to-source on-resistance to reduce the power loss. Compared to the laterally diffused metal-oxide-semiconductor device in the prior art, the present invention utilizes the first drain contact plug 261 to effectively reduce the horizontal extension length and increase the integration degree of the device. Moreover, the first drain metal layer 26, which is disposed on the bottom surface 201 of the substrate 20, can be in contact with the first drain contact plug 261 by the design of the trench 205. Accordingly, the contact area can be effectively increased, and the drain-to-source on-resistance can be reduced.

The laterally diffused metal-oxide-semiconductor device of the present invention is not limited to the aforementioned embodiments and may have different embodiments. To simplify the description and for the convenience of comparison between each of the embodiments of the present invention, identical elements are denoted by identical numerals. Also, only the differences are illustrated, and repeated descriptions are not redundantly given. In addition, the left part (A) and the right part (B) in the figure also respectively illustrate different examples of the laterally diffused metal-oxide-semiconductor devices in the present invention, and the laterally diffused metal-oxide-semiconductor devices in each embodiment share the drain contact plug and the source polysilicon layer. In the same way, the basic unit without sharing the drain contact plug and the source polysilicon layer is also within the protection of the present invention.

Figure 4:
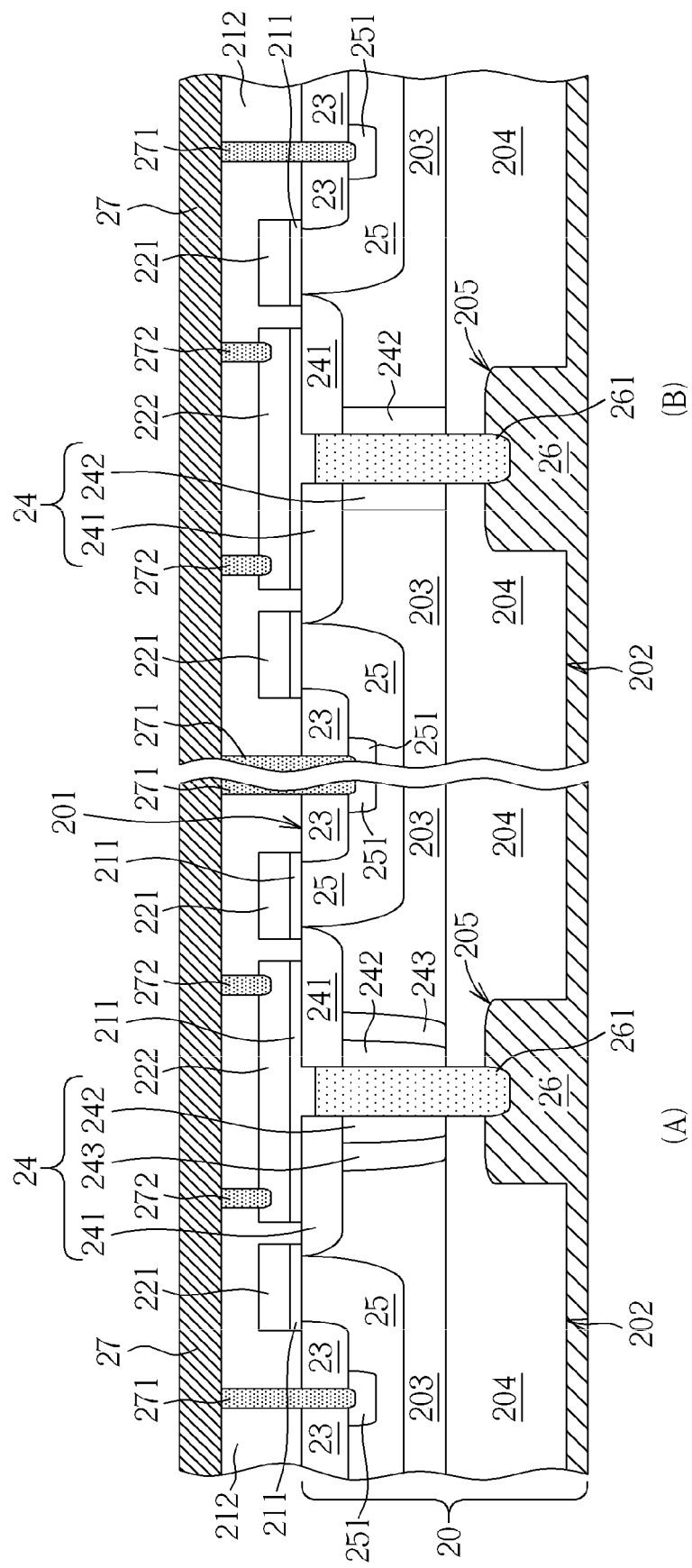
FIG. 4 is a schematic cross-sectional view illustrating a laterally diffused metal-oxide-semiconductor device according to another example of the first preferred embodiment of the present invention.

Please refer to FIG. 4, which is a schematic cross-sectional view illustrating a laterally diffused metal-oxide-semiconductor device according to another example of the first preferred embodiment of the present invention. The difference between FIG. 4 and FIG. 2 is the relative position of the lightly doped drain region 241, the heavily doped drain region 242, and the deep drain region 243 in the drain region 24, and the left part (A) and the right part (B) respectively show two different types of the drain region 24. As shown in FIG. 4, for the left part (A) and the right part (B), the lightly doped drain region 241 is in contact with the first drain contact plug 261. In contrast, the heavily doped drain region 242 in FIG. 2 is disposed between the lightly doped drain region 241 and the first drain contact plug 261, so that the lightly doped drain region 241 is not in contact with the first drain contact plug 261 in FIG. 2. Moreover, the difference between the left part (A) and the right part (B) in FIG. 4 is that the drain region 24 of the right part (B) only includes the lightly doped drain region 241 and the heavily doped drain region 242, and the drain region 24 of the right part (B) does not include the deep drain region 243.

Figure 5:
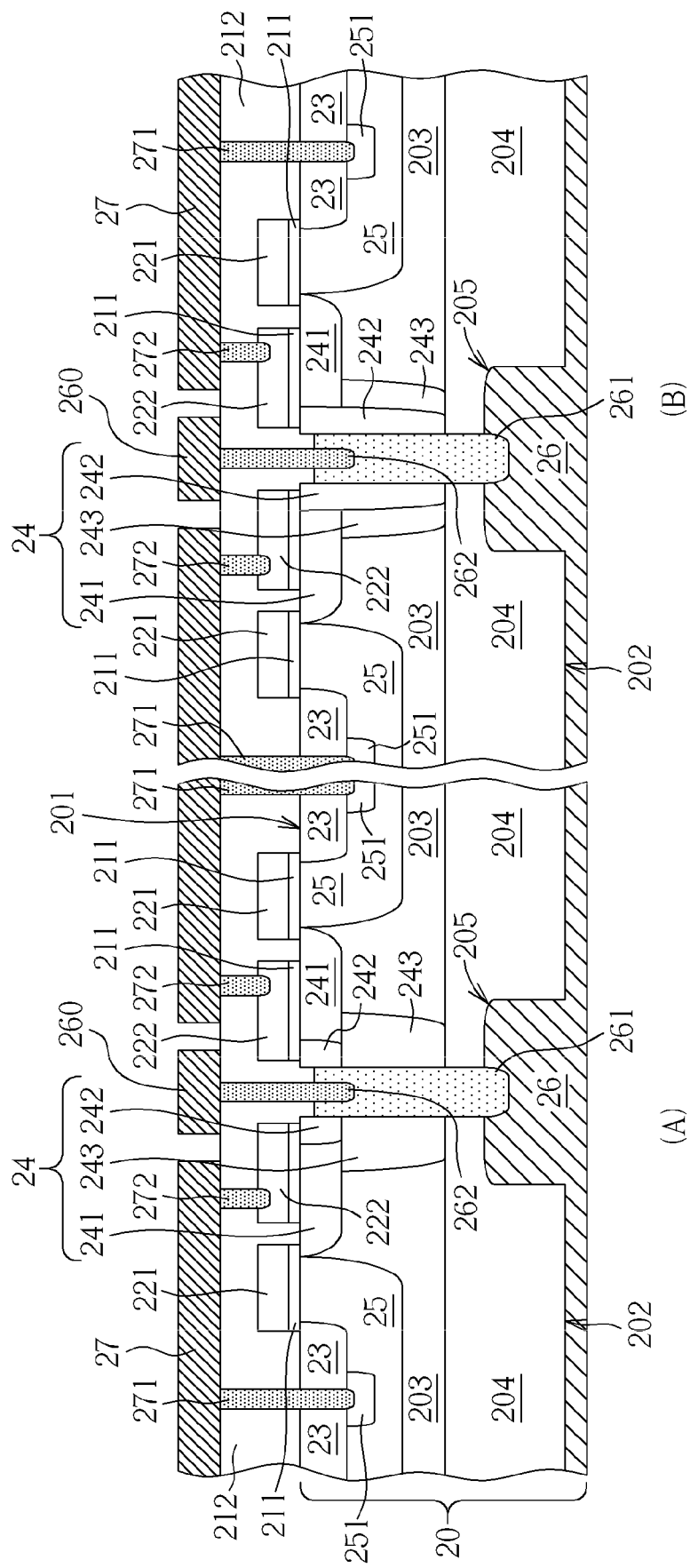
FIGS. 5 and 6 are schematic cross-sectional views illustrating laterally diffused metal-oxide-semiconductor devices according to examples of a second preferred embodiment of the present invention.
Figure 6:
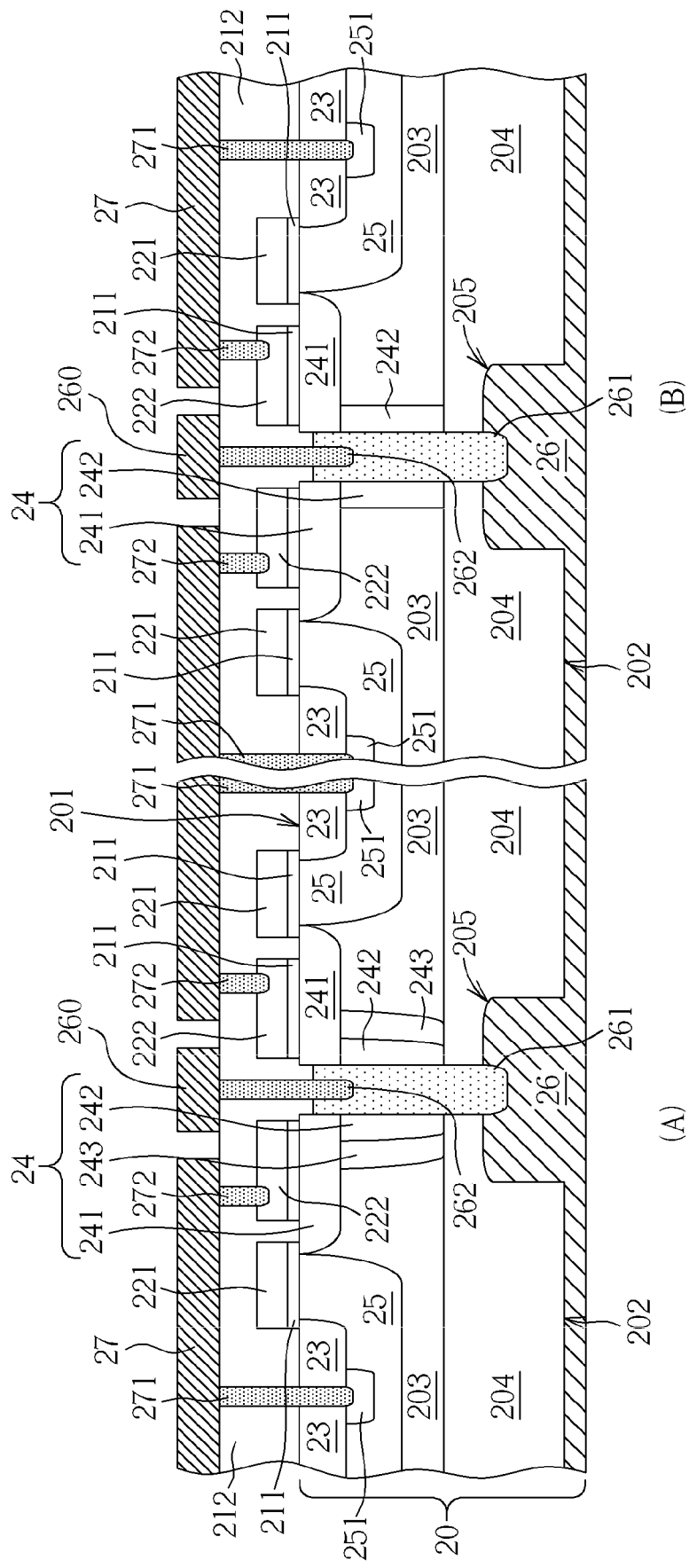

Please refer to FIGS. 5 and 6, which are schematic cross-sectional views illustrating laterally diffused metal-oxide-semiconductor devices according to examples of a second preferred embodiment of the present invention. As shown in FIGS. 5 and 6, the difference between the second preferred embodiment and the first preferred embodiment (as shown in FIGS. 2 and 4) is that the laterally diffused metal-oxide-semiconductor device of the second preferred embodiment further includes a second drain metal layer 260 and a second drain contact plug 262. The second drain metal layer 260 is disposed on the insulating layer 212, and the second drain contact plug 262 passes through the insulating layer 212 and electrically connects the second drain metal layer 260 to the first drain contact plug 261. Furthermore, due to the second drain contact plug 262, the source polysilicon layer 222 of the second preferred embodiment is divided into two source polysilicon layers 222 in the cross-sectional views as shown in FIGS. 5 and 6. It should be noted that two source polysilicon layers 222 may connect to each other or may not connect to each other in the top views (not shown in the figure). For example, a hole (not shown in the figure) may be formed in the source polysilicon layer 222 of the second preferred embodiment, so that the second drain contact plug 262 can pass through the source polysilicon layer 222, and two separate source polysilicon layers 222 are still shown in the cross-sectional view.

Figure 7:
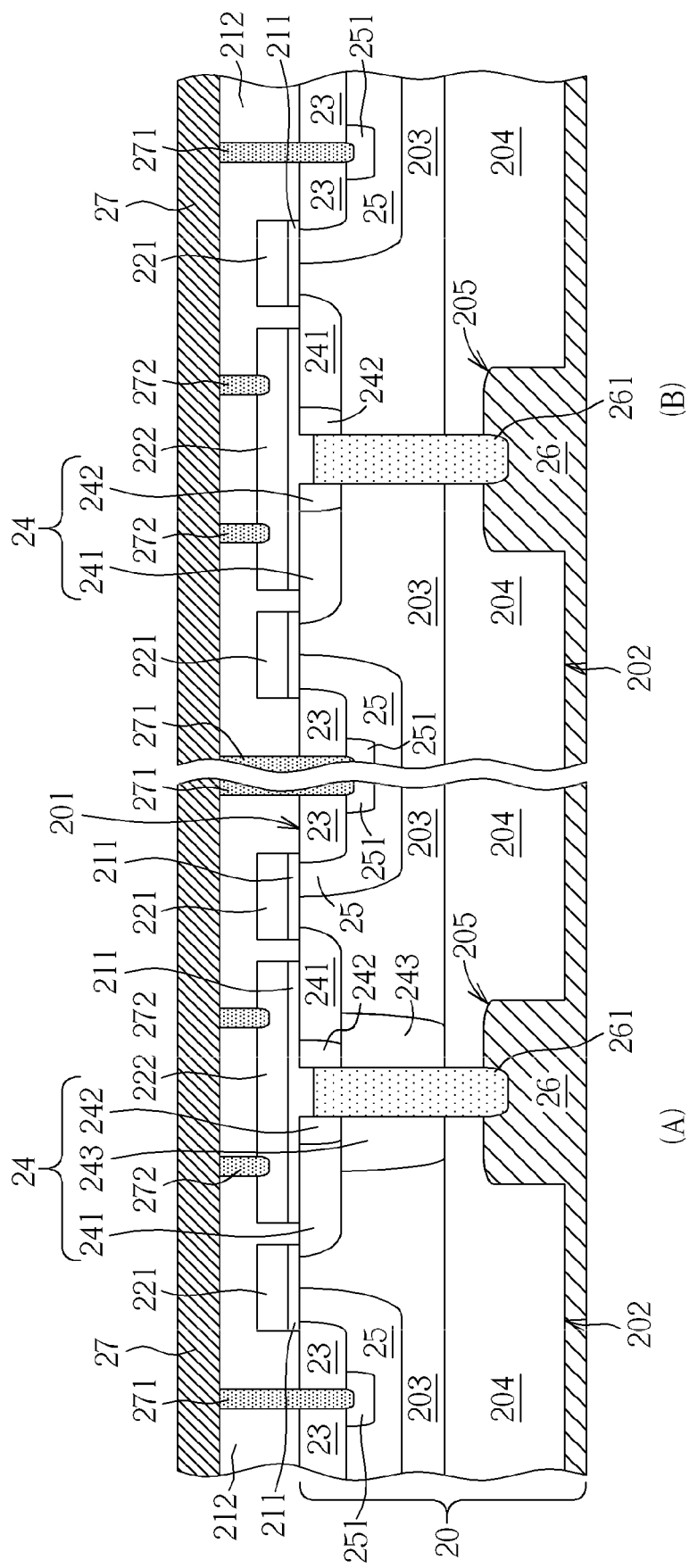
FIGS. 7 and 8 are schematic cross-sectional views illustrating laterally diffused metal-oxide-semiconductor devices according to examples of a third preferred embodiment of the present invention.
Figure 8:
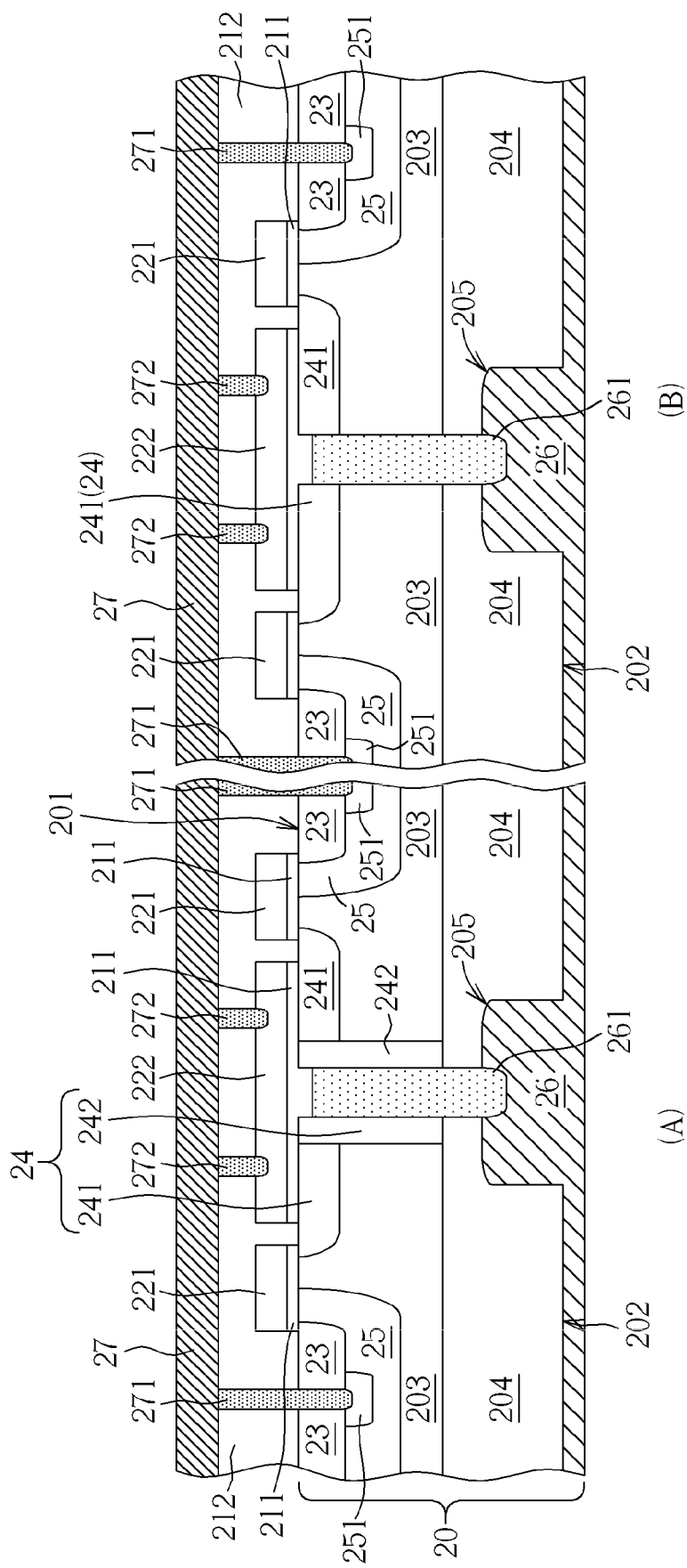

Please refer to FIGS. 7 and 8, which are schematic cross-sectional views illustrating laterally diffused metal-oxide-semiconductor devices according to examples of a third preferred embodiment of the present invention. The difference between the third preferred embodiment and the first preferred embodiment is that the epitaxial layer 203 and the base layer 204 of the third preferred embodiment have the same conductive type and the position of the body region 25 is varied. As shown in FIGS. 7 and 8, the conductivity type of the epitaxial layer 203 is the same as that of the source region 23 and the drain region 24. Accordingly, the epitaxial layer 203 has the first conductivity type, and the base layer 204 also has the first conductivity type. More specifically, in the third preferred embodiment, the epitaxial layer 203 is n-type lightly doped, and the base layer 204 is n-type heavily doped. But it is not limited herein and may be adjusted according to the demand of the product specifications and process requirements. Furthermore, the body region 25 of the third preferred embodiment is similar to that of the first the third preferred embodiment. That is, the body region 25 surrounds the source region 23 and extends to the substrate 20 under the gate polysilicon layer 221. But the body region 25 of the third preferred embodiment is only disposed under a portion of the gate polysilicon layer 221. More specifically, the epitaxial layer 203 of the third preferred embodiment passes through between the source region 23 and the drain region 24, and the epitaxial layer 203 is in contact with the gate dielectric layer 211 and occupies a portion of the space under the gate polysilicon layer 221.

Since the epitaxial layer 203 and the drain region 24 have the same conductive type, such as n-type, the drain regions 24 of FIGS. 7 and 8 also have different types. As shown in FIG. 7, the drain region 24 of the left part (A) of FIG. 7 is the same as that of the left part (A) of FIG. 2, and the drain region 24 of the right part (B) of FIG. 7 only includes the lightly doped drain region 241 and the heavily doped drain region 242 and does not include the deep drain region 243 which is shown in the left part (A) of FIG. 7. As shown in the left part (A) of FIG. 8, the drain region 24 only includes the lightly doped drain region 241 and the heavily doped drain region 242, and the difference between the left part (A) of FIG. 8 and the right part (B) of FIG. 7 is that the heavily doped drain region 242 in the left part (A) of FIG. 8 extends from the upper surface 201 of the substrate 20 to the base layer 204. As shown in the right part (B) of FIG. 8, the drain region 24 only includes the lightly doped drain region 241 and does not include the heavily doped drain region 242 or the deep drain region 243 which is shown in the left part (A) of FIG. 7.

Figure 9:
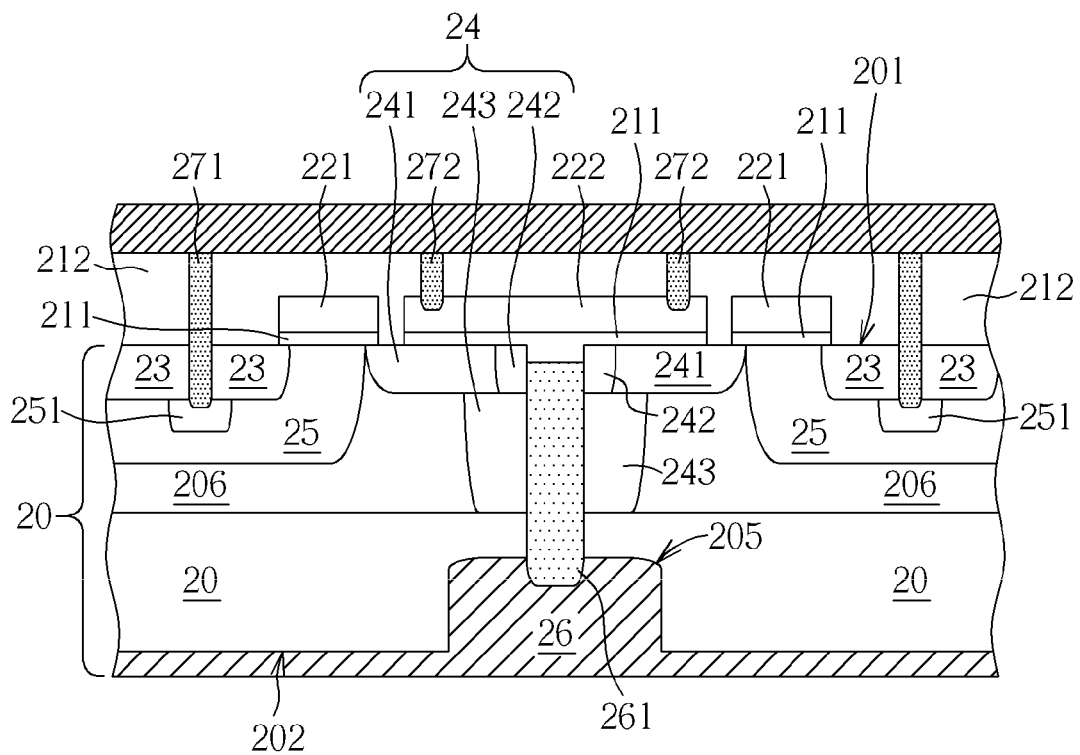
FIG. 9 is a schematic cross-sectional view illustrating a laterally diffused metal-oxide-semiconductor device according to a fourth preferred embodiment of the present invention.
Figure 10:
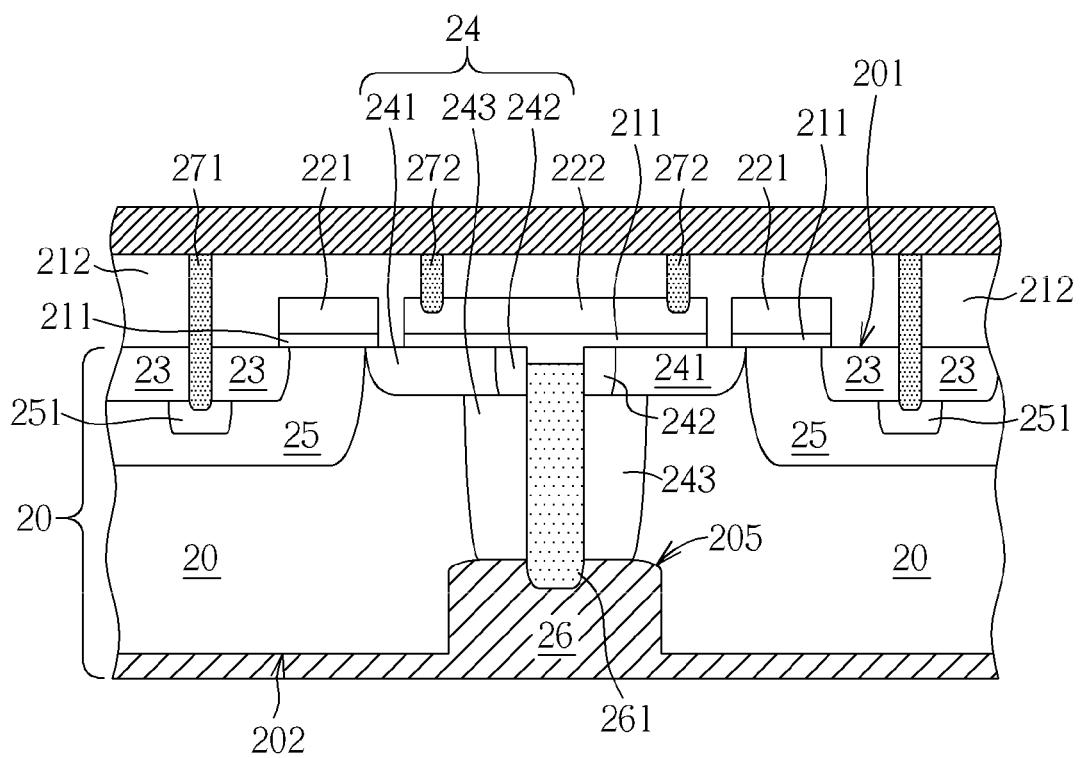
FIG. 10 is a schematic cross-sectional view illustrating a laterally diffused metal-oxide-semiconductor device according to another example of the fourth preferred embodiment of the present invention.

Please refer to FIGS. 9 and 10, which are schematic cross-sectional views illustrating two examples of the laterally diffused metal-oxide-semiconductor device according to a fourth preferred embodiment of the present invention. The difference between the fourth preferred embodiment and the aforementioned preferred embodiments is that the epitaxial layer 203 in the aforementioned preferred embodiments is not required to be disposed on the substrate 20 of the fourth preferred embodiment. As shown in FIG. 9, the substrate 20 and the drain region 24 have the first conductivity type, and the substrate 20 further includes a deep doped region 206 which has the second conductivity type. Also, the source region 23, the drain region 24, and the body region 25 are disposed in the deep doped region 206. More specifically, in the present preferred embodiment, the substrate 20 is n-type doped, and the deep doped region 206 is p-type doped. As shown in FIG. 10, the substrate 20 of the present embodiment has the second conductivity type, and the conductivity type of the substrate 20 is different from that of the source region 23 and the drain region 24. Also, the deep drain region 243 of the drain region 24 extends downward from the lightly doped drain region 241 and the heavily doped drain region 242 to contact the first drain metal layer 26 in the trench 205. Accordingly, forming an epitaxial layer in the substrate 20 is not required in the fourth preferred embodiment, and the manufacturing cost of the epitaxial layer can be reduced to decrease the manufacturing cost of the device.

In summary, the laterally diffused metal-oxide-semiconductor device of the present invention utilizes the source polysilicon layer, which is disposed on the gate dielectric layer above the drain region, to serve as a field plate for reducing electric field. The voltage-withstand ability of the laterally diffused metal-oxide-semiconductor device can be improved, and the laterally diffused metal-oxide-semiconductor device can have a higher breakdown voltage. Also, the source polysilicon layer can effectively increase the drain-to-source capacitance and improve the output capacitance. Compared to the trench semiconductor device with the vertical structure in the prior art, the laterally diffused metal-oxide-semiconductor device of the present invention can effectively decrease the gate-to-drain capacitance and reduce the input capacitance and the reverse transfer capacitance. In addition, by the first drain contact plug, the present invention can improve the drain-to-source on-resistance to reduce the power loss. Also, the present invention can effectively reduce the horizontal extension length and increase the integration degree of the device. The first drain metal layer, which is disposed on the bottom surface of the substrate, can be in contact with the first drain contact plug by the design of the trench, so that the contact area can be effectively increased and the drain-to-source on-resistance can be reduced. Furthermore, an epitaxial layer may not be formed in the substrate, and the manufacturing cost of the epitaxial layer can be reduced to decrease the manufacturing cost of the device.

Those skilled in the art will readily observe that numerous modifications and alterations of the device and method may be made while retaining the teachings of the invention.

What is claimed is:

1. A laterally diffused metal-oxide-semiconductor device, comprising:
    a substrate, having an upper surface and a bottom surface;
    a gate dielectric layer, disposed on the upper surface of the substrate;
    a gate polysilicon layer, disposed on the gate dielectric layer;
    a source region and a drain region, both having a first conductivity type, the source region and the drain region being disposed in the substrate and respectively located at two opposite sides of the gate polysilicon layer, wherein a part of the gate dielectric layer is disposed right above the drain region;
    a body region, having a second conductivity type, the body region surrounding the source region and extending to the substrate under the gate polysilicon layer;
    a first drain contact plug, disposed in the substrate and located at a side of the drain region opposite to the source region, and the first drain contact plug being in contact with the drain region;
    a source polysilicon layer, disposed on the part of the gate dielectric layer right above the drain region, and the source polysilicon layer being electrically connected to the source region;
    an insulating layer, disposed on the substrate and covering the gate polysilicon layer, the source polysilicon layer, and the gate dielectric layer, and the source polysilicon layer being disposed between the insulating layer and the part of the gate dielectric layer; and
    a source metal layer, disposed on the insulating layer, and the source metal layer electrically connecting the source polysilicon layer and the source region.

2. The laterally diffused metal-oxide-semiconductor device of claim 1, further comprising a first source contact plug, passing through the insulating layer and electrically connecting the source metal layer to the source region.

3. The laterally diffused metal-oxide-semiconductor device of claim 1, further comprising a second source contact plug, disposed in the insulating layer and electrically connecting the source metal layer to the source polysilicon layer.

4. The laterally diffused metal-oxide-semiconductor device of claim 1, further comprising a trench, disposed in the substrate adjacent to the bottom surface and under the first drain contact plug.

5. The laterally diffused metal-oxide-semiconductor device of claim 4, further comprising a first drain metal layer, disposed on the bottom surface of the substrate and filling the trench, and the first drain metal layer being electrically connected to the first drain contact plug.

6. The laterally diffused metal-oxide-semiconductor device of claim 1, further comprising a second drain metal layer, disposed on the insulating layer.

7. The laterally diffused metal-oxide-semiconductor device of claim 1, further comprising a second drain contact plug, passing through the insulating layer and electrically connecting the second drain metal layer to the first drain contact plug.

8. The laterally diffused metal-oxide-semiconductor device of claim 1, further comprising a heavily doped body region, having the second conductivity type, disposed in the body region under the source region.

9. The laterally diffused metal-oxide-semiconductor device of claim 1, wherein the drain region comprises a lightly doped drain region, and a surface of the lightly doped drain region is the upper surface of the substrate.

10. The laterally diffused metal-oxide-semiconductor device of claim 9, wherein the drain region further comprises a heavily doped drain region, and the heavily doped drain region is respectively in contact with the lightly doped drain region and the first drain contact plug.

11. The laterally diffused metal-oxide-semiconductor device of claim 10, wherein the drain region further comprises a deep drain region, and the deep drain region is disposed at a side of the heavily doped drain region, and the deep drain region is respectively in contact with the heavily doped drain region and the lightly doped drain region.

12. The laterally diffused metal-oxide-semiconductor device of claim 1, wherein the substrate has the first conductivity type.

13. The laterally diffused metal-oxide-semiconductor device of claim 12, wherein the substrate further comprises a deep doped region which has the second conductivity type, and the drain region and the body region are disposed in the deep doped region.

14. The laterally diffused metal-oxide-semiconductor device of claim 1, wherein the substrate has the second conductivity type.

15. The laterally diffused metal-oxide-semiconductor device of claim 1, wherein the substrate further comprises an epitaxial layer and a base layer, and the epitaxial layer is disposed at a side which is adjacent to the upper surface of the substrate, the base layer is disposed at a side which is adjacent to the bottom surface of the substrate, and the source region, the drain region, and the body region are disposed in the epitaxial layer.

16. The laterally diffused metal-oxide-semiconductor device of claim 15, wherein the epitaxial layer has the second conductivity type, and the base layer has the first conductivity type.

17. The laterally diffused metal-oxide-semiconductor device of claim 15, wherein the epitaxial layer has the first conductivity type, and the base layer has the first conductivity type.

18. The laterally diffused metal-oxide-semiconductor device of claim 1, wherein the gate polysilicon layer and the source polysilicon layer are formed by a same polysilicon layer.

19. The laterally diffused metal-oxide-semiconductor device of claim 1, wherein the source polysilicon layer is in contact with the part of the gate dielectric layer.

20. A laterally diffused metal-oxide-semiconductor device, comprising:
    a substrate, having an upper surface and a bottom surface;
    a gate dielectric layer, disposed on the upper surface of the substrate;

a gate polysilicon layer, disposed on the gate dielectric layer;

a source region and a drain region, both having a first conductivity type, the source region and the drain region being disposed in the substrate and respectively located at two opposite sides of the gate polysilicon layer;

a body region, having a second conductivity type, the body region surrounding the source region and extending to the substrate under the gate polysilicon layer;

a drain contact plug, disposed in the substrate and located at a side of the drain region opposite to the source region, and the drain contact plug being in contact with the drain region;

a trench disposed in the substrate, the trench being adjacent to the bottom surface and under the drain contact plug; and a drain metal layer, disposed on the bottom surface of the substrate and filling the trench, and the drain metal layer being in contact with the drain contact plug.

* * * * *